(12) United States Patent
Lee et al.

(10) Patent No.: US 9,106,243 B2
(45) Date of Patent: Aug. 11, 2015

(54) SUCCESSIVE APPROXIMATION ANALOG-TO-DIGITAL CONVERTER AND METHOD OF ANALOG-TO-DIGITAL CONVERSION

(71) Applicant: Samsung Electronics Co., Ltd., Suwon-Si, Gyeonggi-Do (KR)

(72) Inventors: Choong-Hoon Lee, Seoul (KR); Michael Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/451,080

(22) Filed: Aug. 4, 2014

(65) Prior Publication Data

US 2015/0061904 A1    Mar. 5, 2015

(30) Foreign Application Priority Data

Sep. 4, 2013    (KR) .................. 10-2013-0106198

(51) Int. Cl.
*H03M 1/12* (2006.01)
*H03M 1/06* (2006.01)
*H03M 1/00* (2006.01)

(52) U.S. Cl.
CPC ............ *H03M 1/0617* (2013.01); *H03M 1/001* (2013.01); *H03M 1/002* (2013.01); *H03M 1/1245* (2013.01)

(58) Field of Classification Search
CPC ....... H03M 1/468; H03M 1/804; H03M 1/68; H03M 1/46; H03M 1/1038; H03M 1/1061; H03M 1/125; H03M 1/466; H03M 1/12; H03M 1/806; H03M 1/0607; H03M 1/089; H03M 1/1009; H03M 1/403; H03M 1/1023

USPC .......................... 341/118, 120, 155, 172, 144
See application file for complete search history.

(56) References Cited

U.S. PATENT DOCUMENTS

| | | | | |
|---|---|---|---|---|
| 5,638,072 A | * | 6/1997 | Van Auken et al. | 341/141 |
| 5,684,487 A | * | 11/1997 | Timko | 341/172 |
| 6,313,769 B1 | * | 11/2001 | Mangahas et al. | 341/118 |
| 6,351,231 B1 | * | 2/2002 | Price et al. | 341/155 |
| 6,380,881 B2 | * | 4/2002 | Harada et al. | 341/165 |
| 6,809,674 B1 | * | 10/2004 | Ramsden | 341/155 |
| 6,844,840 B1 | * | 1/2005 | Melanson | 341/161 |

(Continued)

FOREIGN PATENT DOCUMENTS

KR        101191054 B1    10/2012

*Primary Examiner* — Linh Nguyen
(74) *Attorney, Agent, or Firm* — Harness, Dickey & Pierce, P.L.C.

(57) ABSTRACT

An analog-to-digital converter includes a digital-to-analog converting circuit, a comparator, a comparator offset detector, and a signal processing circuit. The digital-to-analog converting circuit generates a reference voltage signal that changes in response to a comparator offset compensation signal, samples and holds an analog input signal, and performs a digital-to-analog conversion on digital output data to generate a hold voltage signal. The comparator compares the hold voltage signal with the reference voltage signal in response to a clock signal to generate a comparison output voltage signal. The comparator offset detector generates the comparator offset compensation signal based on the comparison output voltage signal. The signal processing circuit performs successive approximation based on the comparison output voltage signal to generate the digital output data.

19 Claims, 14 Drawing Sheets

(56) References Cited

U.S. PATENT DOCUMENTS

| | | | |
|---|---|---|---|
| 7,501,965 B2 * | 3/2009 | Janakiraman | 341/118 |
| 7,977,979 B2 | 7/2011 | Cho et al. | |
| 8,248,108 B2 | 8/2012 | Santoro et al. | |
| 8,344,925 B1 * | 1/2013 | Evans | 341/155 |
| 8,786,483 B1 * | 7/2014 | Thompson et al. | 341/161 |
| 2002/0021237 A1 * | 2/2002 | Redman-White et al. | 341/136 |
| 2003/0179124 A1 * | 9/2003 | Harada | 341/161 |
| 2005/0231412 A1 * | 10/2005 | Confalonieri et al. | 341/155 |
| 2012/0007758 A1 * | 1/2012 | Lee et al. | 341/122 |
| 2013/0088375 A1 * | 4/2013 | Wu et al. | 341/120 |

* cited by examiner

FIG. 2
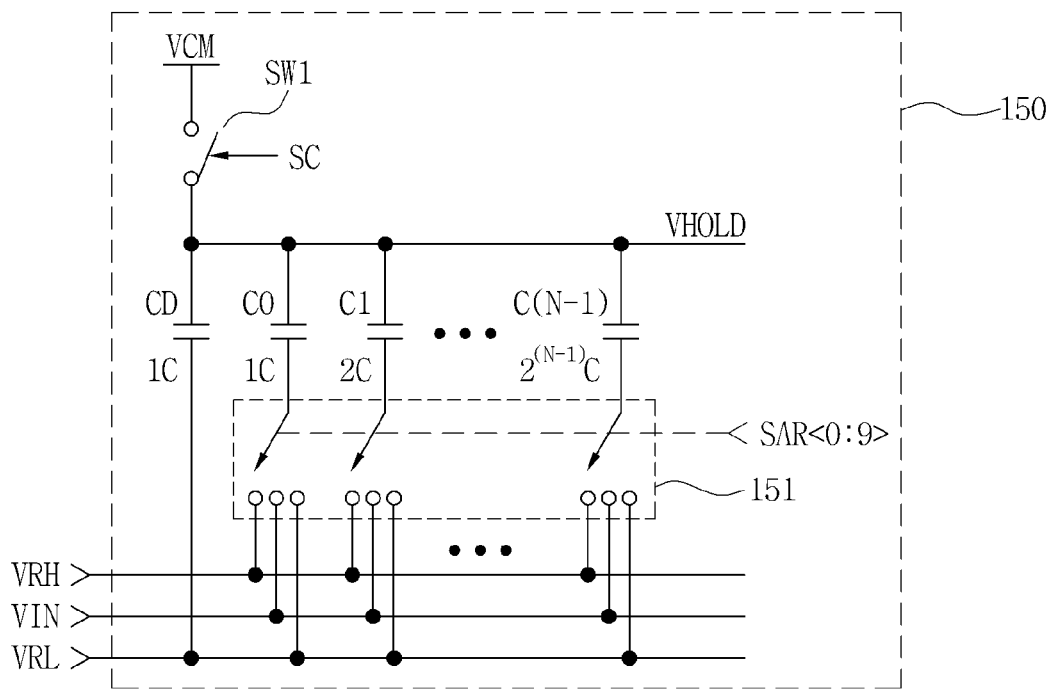
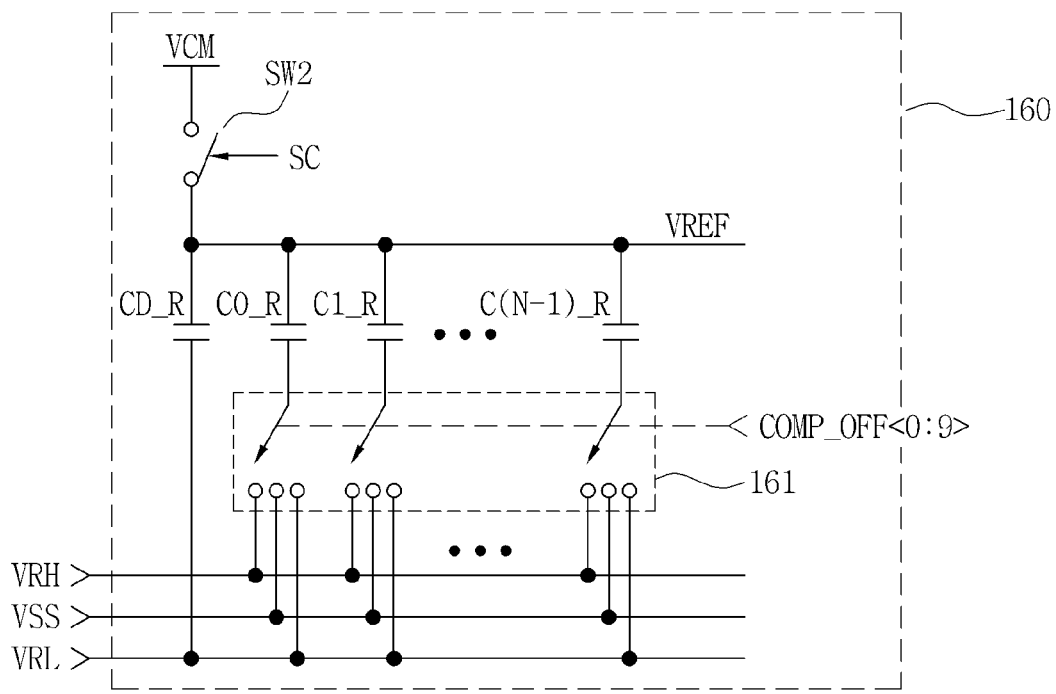

SUCCESSIVE APPROXIMATION ANALOG-TO-DIGITAL CONVERTER AND METHOD OF ANALOG-TO-DIGITAL CONVERSION

CROSS-REFERENCE TO RELATED APPLICATION

This application claims priority under 35 U.S.C. §119 to Korean Patent Application No. 10-2013-0106198 filed on Sep. 4, 2013, the disclosure of which is hereby incorporated by reference in its entirety.

BACKGROUND

1. Field

Example embodiments of the inventive concepts relate to an analog-to-digital converter, and particularly, to an analog-to-digital converter performing analog-to-digital conversion using successive approximation and/or a method of analog-to-digital conversion.

2. Description of Related Art

Analog-to-digital converters may be used to generate a sequence of digital codes representing signal levels of an analog signal. To perform Analog-to-digital conversion, a successive-approximation technique that performs analog-to-digital conversion and compares data to determine bits of a digital code may be used. In a successive-approximation technique, an analog signal may be converted by using a binary search of quantization levels to converge upon a digital output.

SUMMARY

Example embodiments of the inventive concepts provide an analog-to-digital converter that performs analog-to-digital conversion using a successive-approximation technique and decreases a comparator offset without consuming much power.

Example embodiments of the inventive concepts also provide a method of analog-to-digital conversion with which an analog-to-digital converter performs analog-to-digital conversion using a successive-approximation technique and decreases a comparator offset without consuming much power.

The technical objectives of the inventive concepts are not limited to the above disclosure; other objectives may become apparent to those of ordinary skill in the art based on the following descriptions.

In accordance with an example embodiment of the inventive concepts, an analog-to-digital converter includes a digital-to-analog converting circuit, a comparator, a comparator offset detector, and a signal processing circuit.

The digital-to-analog converting circuit generates a reference voltage signal that changes in response to a comparator offset compensation signal, samples and holds an analog input signal, and performs a digital-to-analog conversion on digital output data to generate a hold voltage signal (VHOLD). The comparator compares the hold voltage signal with the reference voltage signal in response to a clock signal to generate a comparison output voltage signal. The comparator offset detector generates the comparator offset compensation signal based on the comparison output voltage signal. The signal processing circuit performs successive approximation based on the comparison output voltage signal to generate the digital output data.

In some example embodiments, the analog-to-digital converter may perform an analog-to-digital conversion on a comparator offset to generate the comparator offset compensation signal in a comparator offset compensation mode, and may adjust a magnitude of the reference voltage signal in response to the comparator offset compensation signal in an analog-to-digital conversion mode.

In some example embodiments, the comparator offset detector may generate one bit of the comparator offset compensation signal during one analog-to-digital conversion cycle in the comparator offset compensation mode.

In some example embodiments, the comparator offset detector may generate n bits of the comparator offset compensation signal during n analog-to-digital conversion cycles (n is a natural number greater than or equal to 2), provide the comparator offset compensation signal to the digital-to-analog converting circuit, and adjust a magnitude of the reference voltage signal, in the comparator offset compensation mode.

In some example embodiments, the digital-to-analog converting circuit may include an input sampling capacitor array and a reference capacitor array.

The input sampling capacitor array samples and holds the analog input signal in an input sampling mode, and performs a digital-to-analog conversion on the digital output data to generate the hold voltage signal (VHOLD) in an analog-to-digital conversion mode. The reference capacitor array performs an analog-to-digital conversion on a comparator offset to generate the comparator offset compensation signal in a comparator offset compensation mode, and adjusts a magnitude of the reference voltage signal in response to the comparator offset compensation signal in the analog-to-digital conversion mode.

In some example embodiments, the input sampling capacitor array may include a switch circuit including a plurality of switches, a plurality of capacitors, a first capacitor, and a first switch.

Each of the switches selects one of an input signal, a first reference voltage, and a second reference voltage in response to bits of the digital output data. Each of the capacitors is connected between a first line from which the hold voltage signal is output and each of the switches. The first capacitor is connected between the first line and the second reference voltage. The first switch is connected between a common mode voltage and the first line.

In some example embodiments, the reference capacitor array may include a switch circuit including a plurality of switches, a plurality of capacitors, a first capacitor, and a first switch.

Each of the switches selects one of a ground voltage, a first reference voltage, and a second reference voltage in response to bits of the comparator offset compensation signal. Each of the capacitors is connected between a second line from which the reference voltage signal is output and each of the switches. The first capacitor is connected between the second line and the second reference voltage. The first switch is connected between a common mode voltage and the second line.

In some example embodiments, the comparator may include a first comparator and a second comparator.

The first comparator compares the hold voltage signal with the reference voltage signal in response to a first clock signal to generate a first comparison output voltage signal. The second comparator compares the hold voltage signal with the reference voltage signal in response to a second clock signal having a phase opposite to a phase of the first clock signal to generate a second comparison output voltage signal.

In some example embodiments, the comparator offset detector may include a shift register and a register.

The shift register shifts the comparison output voltage signal one bit at a time in response to the clock signal. The register temporarily stores bits of an output of the shift register, and outputs the comparator offset compensation signal based on the bits of the output of the shift register.

In some example embodiments, the comparator offset detector may include a shift register, a register, and an average circuit.

The shift register shifts the comparison output voltage signal one bit at a time in response to the clock signal. The register temporarily stores bits of an output of the shift register. The average circuit calculates an average of bits of the output of the shift register, and outputs the comparator offset compensation signal based on the average.

In some example embodiments, the comparator offset detector may include a shift register, a register, and a moving average circuit.

The shift register shifts the comparison output voltage signal one bit at a time in response to the clock signal. The register temporarily stores bits of an output of the shift register. The moving average circuit calculates a moving average of bits of the output of the shift register, and outputs the comparator offset compensation signal based on the moving average.

In some example embodiments, the analog-to-digital converter may further include an output register that stores the digital output data, and outputs the digital output data as output data when data to be output is determined by the signal processing circuit.

In some example embodiments, the analog-to-digital converter may further include a timing circuit that generates a conversion control signal based on a clock signal and conversion start signal, and provides the conversion control signal to the signal processing circuit.

In some example embodiments, the digital-to-analog converting circuit may be a binary-weighted-capacitor-type digital-to-analog converting circuit.

In accordance with another example embodiment of the inventive concepts, a method of analog-to-digital conversion includes performing an analog-to-digital conversion on a comparator offset to generate a comparator offset compensation signal in a comparator offset compensation mode; sampling and holding an analog input signal in an input sampling mode; generating a reference voltage signal that changes in response to the comparator offset compensation signal in an analog-to-digital conversion mode; performing a digital-to-analog conversion on digital output data to generate a hold voltage signal (VHOLD) in the analog-to-digital conversion mode; comparing the hold voltage signal with the reference voltage signal in response to a clock signal to generate a comparison output voltage signal; and performing successive approximation based on the comparison output voltage signal to generate the digital output data.

In some example embodiments, the generating of the comparator offset compensation signal may include generating n bits of the comparator offset compensation signal during n analog-to-digital conversion cycles (n is a natural number greater than or equal to 2) in the comparator offset compensation mode; and providing the comparator offset compensation signal to a digital-to-analog converting circuit to adjust a magnitude of the reference voltage signal.

Therefore, the analog-to-digital converter according to example embodiments of the inventive concepts generates a comparator offset compensation signal based on the output signal of the comparator in the comparator offset compensation mode, and provides the comparator offset compensation signal to the reference capacitor array of the digital-to-analog converting circuit. In the analog-to-digital conversion mode, the magnitude of the reference voltage signal may be adjusted in response to the comparator offset compensation signal. Therefore, the analog-to-digital converter according to example embodiments of the inventive concepts may compensate for a comparator offset without using a preamplifier. Therefore, the analog-to-digital converter according to example embodiments of the inventive concepts may be used in an ultra low power analog-to-digital conversion.

At least one example embodiment relates to an analog-to-digital converter configured to convert an analog input signal to digital output data.

In at least one example embodiment, the analog-to-digital converter includes a comparator configured to compare a hold voltage signal and a reference signal and generate a comparison output voltage signal based on a result of the comparison, the hold voltage signal generated based on the analog input signal, an input to the comparator having an offset associated therewith and the reference signal varying to compensate for the offset; and a signal processing circuit configured to perform analog-to-digital conversion of the comparison output voltage via successive approximation of each bit of the comparison output voltage to generate the digital output data.

In at least one example embodiment, the analog-to-digital converter is configured to compensate for the offset associated with the comparator by varying the reference signal without using a preamplifer.

In at least one example embodiment, the comparator is configured to compare the hold voltage signal with the reference signal in response to a clock signal, and the comparator offset detector is configured to shift the comparison output voltage signal one bit at a time in response to the clock signal.

In at least one example embodiment, the analog-to-digital converter further includes a digital-to-analog conversion circuit configured to, sample and hold the analog input signal to generate the hold voltage signal, and generate the reference signal such that the reference signal varies based on a comparison offset compensation signal; and a comparison offset detector configured to generate the comparison offset compensation signal by performing analog-to-digital conversion on the offset associated with the comparator. One bit of the comparator offset may be digitized each time the analog-to-digital converter performs analog-to-digital conversion on the analog input signal.

In at least one example embodiment, the comparison offset detector generates the comparison offset compensation signal when the analog-to-digital converter is operating in a comparator offset compensation mode, and the digital-to-analog conversion circuit is configured to, sample and hold the analog input signal when the analog-to-digital converter is operating in an input sampling mode, and adjust a magnitude of the reference signal when the analog-to-digital converter is operating in an analog-to-digital conversion mode, wherein the comparator offset compensation mode, the input sampling mode and the analog-to-digital conversion mode occur consecutively.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to be scaled, emphasis instead being placed upon illustrating the principles of the inventive concepts. In the drawings:

FIG. 2 is a circuit diagram illustrating an example of a digital-to-analog converting circuit (DAC) included in the analog-to-digital converter of FIG. 1;

DETAILED DESCRIPTION OF THE EMBODIMENTS

Figure 1:
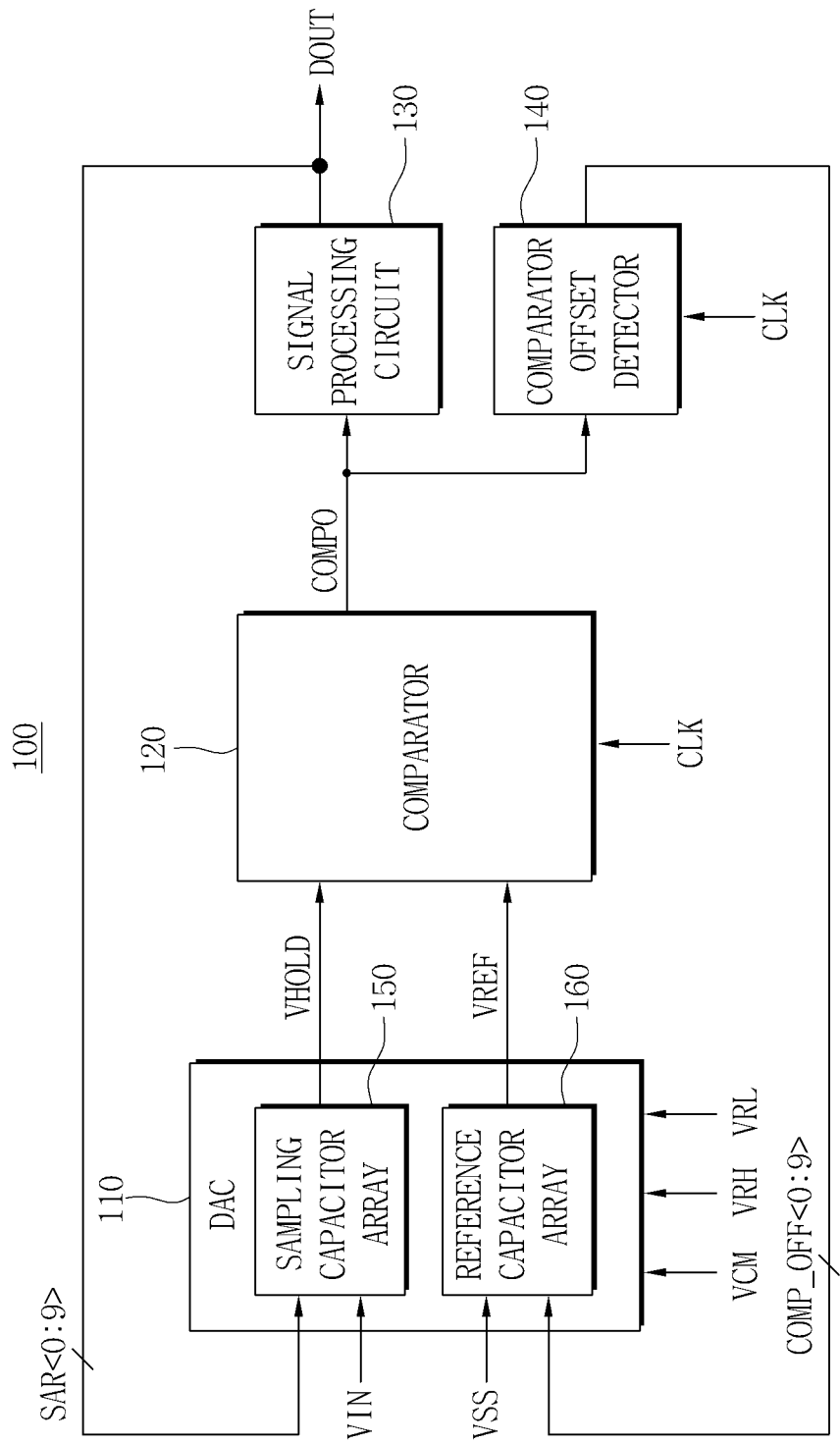
FIG. 1 is a block diagram illustrating an analog-to-digital converter in accordance with an example embodiment of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these example embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to," or "coupled with" another element or layer, it can be directly on, connected, or coupled to the other element or layer or intervening elements or layers may be present. In contrast, when an element is referred to as being "directly on," "directly connected to," or "directly coupled with" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present inventive concept.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which these inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an analog-to-digital converter 100 in accordance with an example embodiment of the inventive concepts.

Referring to FIG. 1, the analog-to-digital converter 100 includes a digital-to-analog converting circuit 110, a comparator 120, a signal processing circuit 130, and a comparator offset detector 140.

The digital-to-analog converting circuit 110 generates a reference voltage signal VREF that changes in response to a comparator offset compensation signal COMP_OFF, samples and holds an analog input signal VIN, and performs a digital-to-analog conversion on digital output data SAR to generate a hold voltage signal VHOLD. In FIG. 1, the digital output data SAR is the same signal as output data DOUT. The comparator 120 compares the hold voltage signal VHOLD with the reference voltage signal VREF in response to a clock signal CLK to generate a comparison output voltage signal COMPO. The comparator offset detector 140 generates the comparator offset compensation signal COMP_OFF based on the comparison output voltage signal COMPO. The signal processing circuit 130 performs successive approximation based on the comparison output voltage signal COMPO to generate the digital output data SAR.

In FIG. 1, the analog-to-digital converter 100 generating digital output data SAR<0:9> of 10 bits is shown as an example.

The analog-to-digital converter 100 of FIG. 1 uses a successive-approximation technique for conversion. The principle of the successive-approximation technique is as follows.

Each bit of a digital code representing a sampled value of an analog signal is determined through a single iteration starting from a most significant bit (MSB). The MSB is set to a specific logic value, for example 1, and the next bit is set to the other logic value, for example 0. The resulting number is converted to an intermediate analog signal using a digital-to-analog converting circuit (DAC). When the sampled value of an analog signal has a voltage level lower than the intermediate analog signal, the MSB of the digital code is determined to be "0". On the contrary, when the sampled value of an analog signal has a voltage level higher than the intermediate analog signal, the MSB of the digital code is determined to be "1". Once the MSB of the digital code is determined, the next significant bit may be set to "1", and the next bit may be set to "0". The number determined in this way is used as a new intermediate analog signal. The new intermediate analog signal is compared with a sampled value of an analog signal to determine a next significant bit of a digital code corresponding to the new intermediate analog signal. This approximation operation is continued until all bits of the digital code are determined.

In a comparator offset compensation mode, the analog-to-digital converter 100 may compensate for an offset of the comparator 120 by adjusting a magnitude of the reference voltage signal VREF in response to the comparator offset compensation signal COMP_OFF. The comparator offset detector 140 may generate one bit of the comparator offset compensation signal COMP_OFF during one analog-to-digital conversion cycle in the comparator offset compensation mode. The comparator offset detector 140 may generate m bits of the comparator offset compensation signal COMP_OFF during m analog-to-digital conversion cycles (m is a natural number greater than or equal to 2), provide the comparator offset compensation signal COMP_OFF to the digital-to-analog converting circuit 110, and adjust a magnitude of the reference voltage signal VREF, in the comparator offset compensation mode.

The digital-to-analog converting circuit 110 may include an input sampling capacitor array 150 and a reference capacitor array 160.

The input sampling capacitor array 150 samples and holds the analog input signal VIN in an input sampling mode, and performs a digital-to-analog conversion on the digital output data SAR to generate the hold voltage signal VHOLD in an analog-to-digital conversion mode. The reference capacitor array 160 performs an analog-to-digital conversion on a comparator offset to generate the comparator offset compensation signal COMP_OFF in the comparator offset compensation mode, and adjusts a magnitude of the reference voltage signal VREF in response to the comparator offset compensation signal COMP_OFF in the analog-to-digital conversion mode.

FIG. 2 is a circuit diagram illustrating an example of a digital-to-analog converting circuit 110 included in the analog-to-digital converter of FIG. 1.

Referring to FIG. 2, the digital-to-analog converting circuit 110 may include the input sampling capacitor array 150 and the reference capacitor array 160. The reference capacitor array 160 may have the same circuit structure as the input sampling capacitor array 150.

The input sampling capacitor array 150 may include a switch circuit 151, a plurality of capacitors C0 to C(N−1), a first capacitor CD, and a first switch SW1.

The switch circuit 151 may include a plurality of switches, each selecting one of an analog input signal VIN, a first reference voltage VRH, and a second reference voltage VRL in response to bits of the digital output data SAR. Each of the plurality of capacitors C0 to C(N−1) is connected between a first line from which the hold voltage signal VHOLD is output and each of the switches. The first capacitor CD is connected between the first line and the second reference voltage VRL. The first switch SW1 is connected between a common mode voltage VCM and the first line.

The reference capacitor array 160 may include a switch circuit 161, a plurality of capacitors C0_R to C(N−1)_R, a second capacitor CD_R, and a second switch SW2.

The switch circuit 161 includes a plurality of switches, and each of the switches selects one of a ground voltage VSS, the first reference voltage VRH, and the second reference voltage VRL in response to bits of the comparator offset compensation signal COMP_OFF. Each of the capacitors C0_R to C(N−1)_R is connected between a second line from which the reference voltage signal VREF is output and each of the switches. The second capacitor CD_R is connected between the second line and the second reference voltage VRL. The second switch SW2 is connected between a common mode voltage VCM and the second line.

The digital-to-analog converting circuit 110 shown in FIG. 2 is a binary-weighted-capacitor-type digital-to-analog converting circuit. The first reference voltage VRH may be a power supply voltage VDD, and the second reference voltage VRL may be a ground voltage VSS. When the analog input signal VIN is input, a switch control signal SW1 is enabled and the first capacitor CD is connected to the common mode voltage VCM (also known as a third reference voltage). The third reference voltage (common mode voltage) VCM may be half of the power supply voltage VDD. As shown in FIG. 2, the capacitances of each of the capacitors C0 to C(N−1) may be increased by a multiple of two. The voltage level of the hold voltage signal VHOLD is changed according to a value of the digital output data SAR<0:9>. That is, the digital-to-analog converting circuit 110 may convert a digital signal to an analog signal.

In FIG. 2, a binary-weighted-capacitor-type digital-to-analog converting circuit is shown, but the analog-to-digital converter 100 may include a ladder-capacitor-type digital-to-analog converting circuit or a split-capacitor-type digital-to-analog converting circuit.

Figure 3:
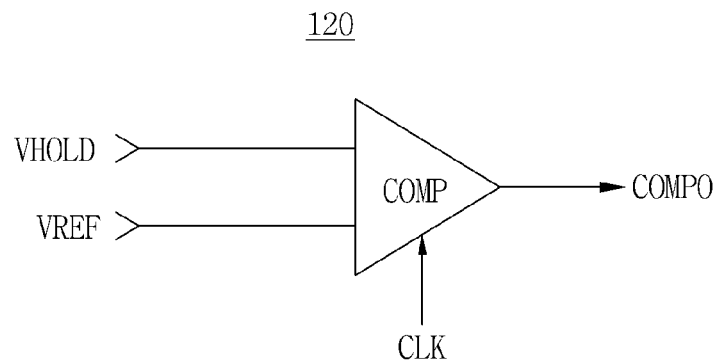
FIG. 3 is a circuit diagram illustrating an example of a comparator included in the analog-to-digital converter of FIG. 1.

FIG. 3 is a circuit diagram illustrating an example of a comparator 120 included in the analog-to-digital converter of FIG. 1.

Referring to FIG. 3, the comparator 120 compares the hold voltage signal VHOLD with the reference voltage signal VREF in response to a clock signal CLK to generate a comparison output voltage signal COMPO.

Figure 4:
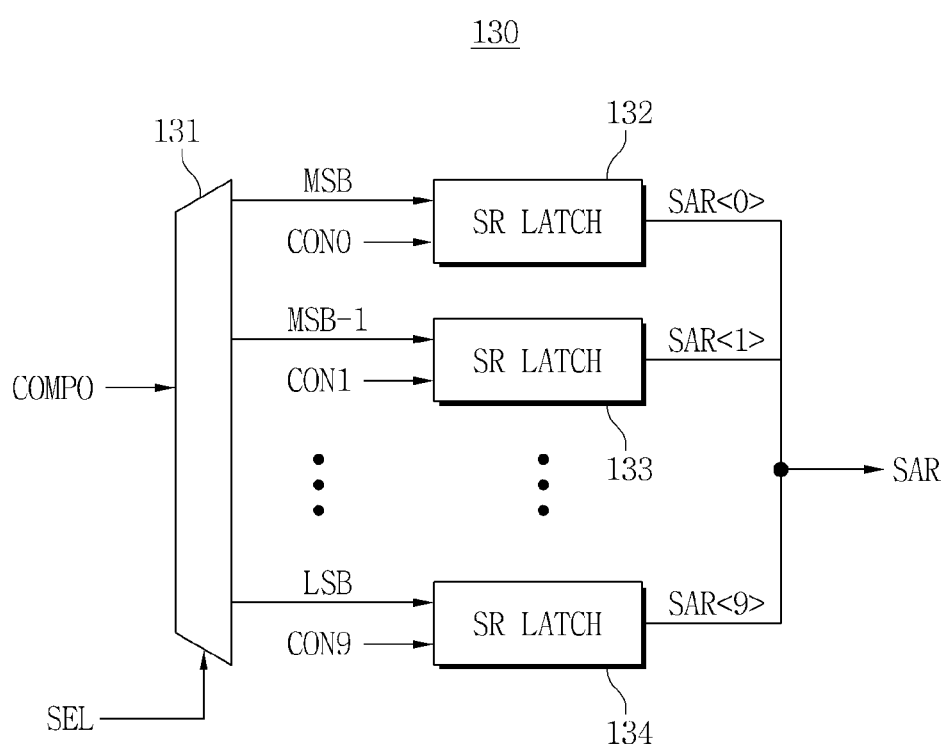
FIG. 4 is a circuit diagram illustrating an example of a signal processing circuit included in the analog-to-digital converter of FIG. 1.

FIG. 4 is a circuit diagram illustrating an example of a signal processing circuit 130 included in the analog-to-digital converter of FIG. 1.

Referring to FIG. 4, the signal processing circuit 130 may include a demultiplexer 131 and set/reset (SR) latches 132, 133, and 134.

The demultiplexer 131 performs demultiplexing on the comparison output voltage signal COMPO in response to a selecting signal SEL. The SR latches 132, 133, and 134 latch and output one of output signals MSB, MSB-1, ..., LSB of the demultiplexer 131 in response to each bit of a conversion control signal CON<0:9>.

When the signal processing circuit 130 of FIG. 4 composed of the demultiplexer 131 and the SR latches 132, 133, and 134 is employed to generate the digital output data SAR<0:9>, a clock timing and a circuit structure may be simple compared to when conventional D-type flip-flops are employed. Therefore, the analog-to-digital converter including the signal processing circuit 130 may have a fast operation speed and a simple circuit structure of a clock generator configured to generate a clock signal.

Outputs of the SR latches 132, 133, and 134 are reset to 000 ... 0 during an input sampling period and have states capable of sampling. The outputs of the SR latches 132, 133, and 134 are initialized and set to 1000 ... 0 just before the comparator 120 operates, and this value is transmitted to the digital-to-analog converting circuit 110. The comparator 120 determines whether a difference between an input signal and a reference voltage is positive or negative. When a comparing operation is started and the comparator 120 compares a signal corresponding to the MSB, the demultiplexer 131 connects an output of the comparator 120 to an SR latch corresponding to the MSB, and stores the compared result in the SR latch. At the same time, an SR latch corresponding to a second significant bit is initialized to "1" for next operation, and a value of the SR latch is set to D100 ... 0. Here, D denotes a determined result of the MSB. This operation is continued until a least significant bit (LSB) is output.

Figure 5:
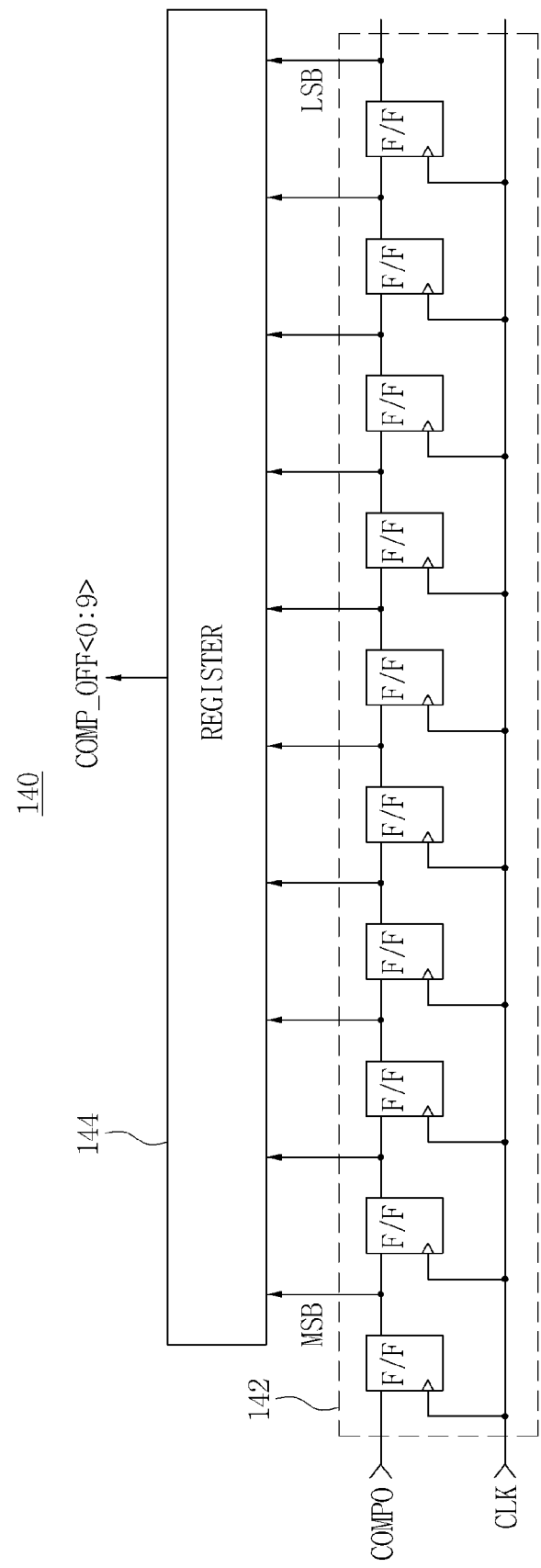
FIG. 5 is a circuit diagram illustrating an example of a comparator offset detector included in the analog-to-digital converter of FIG. 1.

FIG. 5 is a circuit diagram illustrating an example of a comparator offset detector 140 included in the analog-to-digital converter of FIG. 1.

Referring to FIG. 5, the comparator offset detector 140 may include a shift register 142 and a register 144. The shift register 142 may include a plurality of D-type flip-flops, and shifts the comparison output voltage signal COMPO one bit at a time in response to the clock signal CLK. The register 144 temporarily stores bits of an output of the shift register 142, and outputs the comparator offset compensation signal COMP_OFF based on the bits of the output of the shift register 142.

Figure 6:
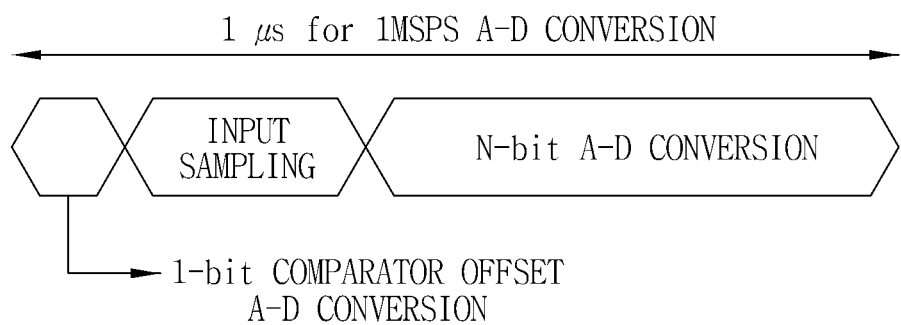
FIG. 6 is a timing diagram illustrating an example of an operation mode of the analog-to-digital converter of FIG. 1.

FIG. 6 is a timing diagram illustrating an example of an operation mode of the analog-to-digital converter 100 of FIG. 1.

Referring to FIG. 6, the analog-to-digital converter 100 according to an example embodiment of the inventive concepts may have a comparator offset compensation mode, an input sampling mode, and an analog-to-digital conversion mode. The analog-to-digital converter 100 converts one bit of a comparator offset by an analog-to-digital conversion, samples the analog input signal VIN in the input sampling mode, and generates n bits of data (n is a natural number greater than or equal to 2) corresponding to the analog input signal VIN by an analog-to-digital conversion in the analog-to-digital conversion mode. In one example, n may be 10. In FIG. 6, an example that the three operating modes exist in 1 μs for the analog-to-digital conversion of one mega sampling per second (MSPS) is shown.

Figure 7:
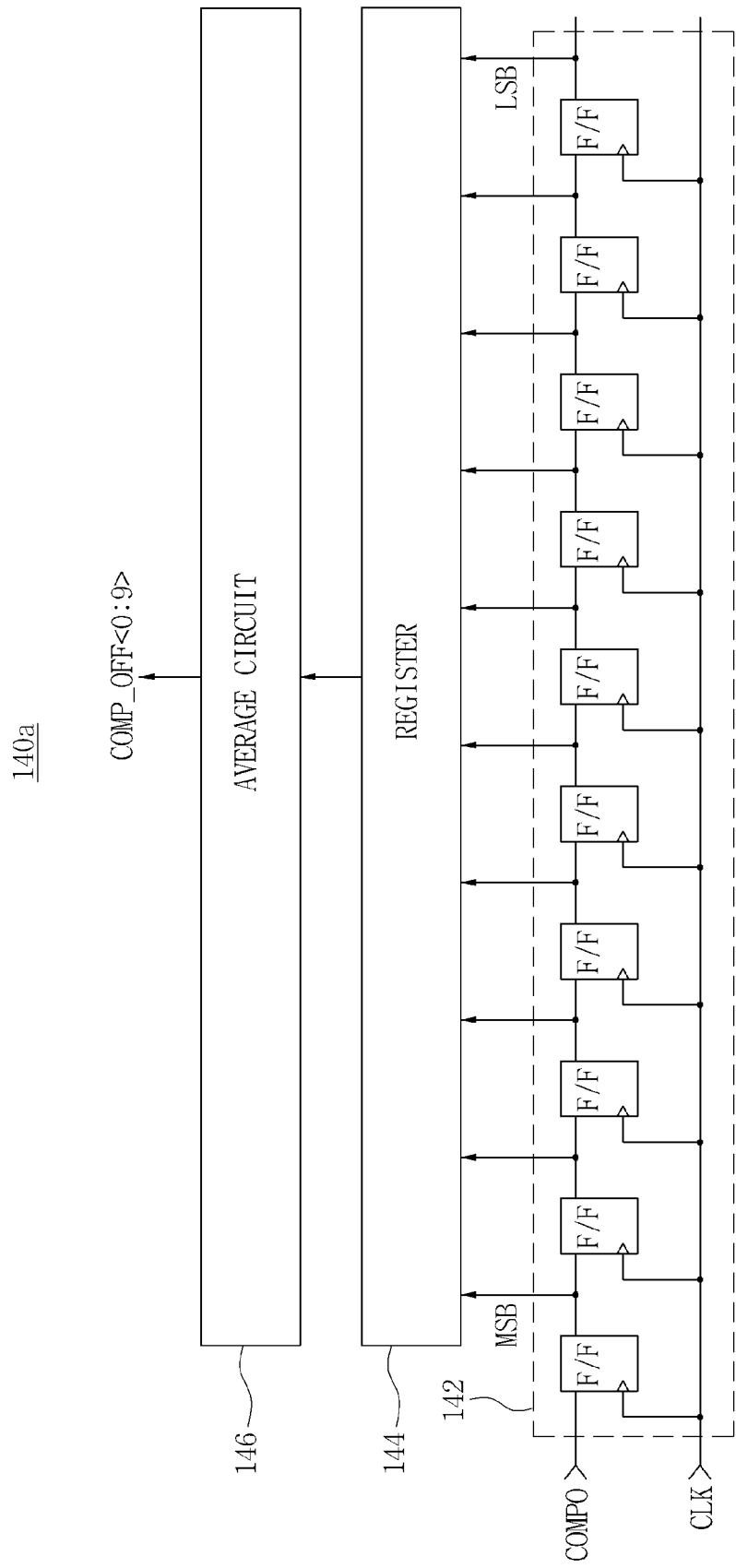
FIG. 7 is a circuit diagram illustrating another example of a comparator offset detector included in the analog-to-digital converter of FIG. 1.

FIG. 7 is a circuit diagram illustrating another example of a comparator offset detector 140a included in the analog-to-digital converter of FIG. 1.

Referring to FIG. 7, the comparator offset detector 140a may include a shift register 142, a register 144, and an average circuit 146. The shift register 142 may consist of a plurality of D-type flip-flops, and shifts the comparison output voltage signal COMPO one bit at a time in response to the clock signal CLK. The register 144 temporarily stores bits of an output of the shift register 142. The average circuit 146 calculates an average of bits of the output of the shift register 142, and outputs the comparator offset compensation signal COMP_OFF based on the average.

Figure 8:
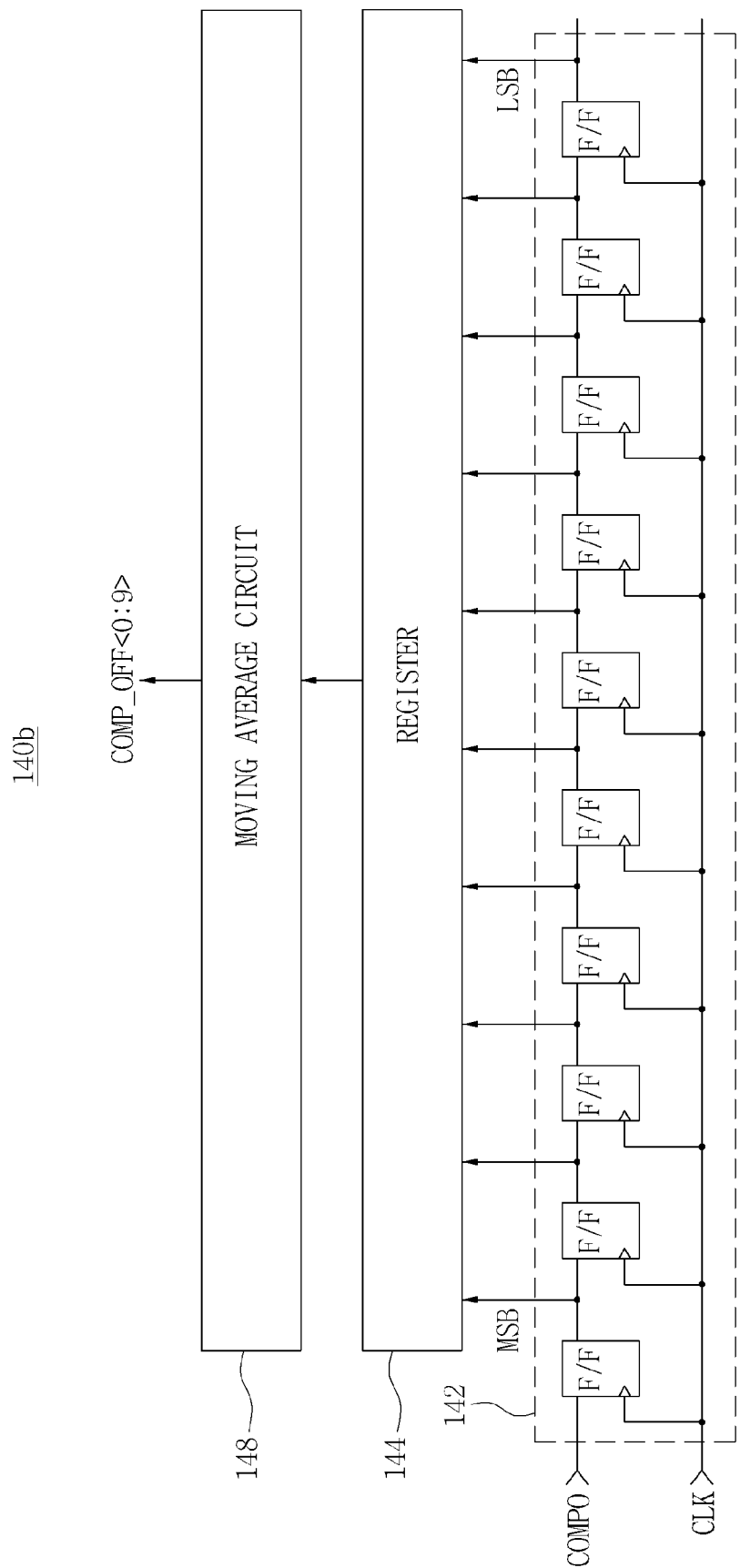
FIG. 8 is a circuit diagram illustrating still another example of a comparator offset detector included in the analog-to-digital converter of FIG. 1.

FIG. 8 is a circuit diagram illustrating still another example of a comparator offset detector 140b included in the analog-to-digital converter 100 of FIG. 1.

Referring to FIG. 8, the comparator offset detector 140b may include a shift register 142, a register 144, and a moving average circuit 148. The shift register 142 may consist of a plurality of D-type flip-flops, and shifts the comparison output voltage signal COMPO one bit at a time in response to the clock signal CLK. The register 144 temporarily stores bits of an output of the shift register 142. The moving average circuit 148 calculates a moving average of bits of the output of the shift register 142, and outputs the comparator offset compensation signal COMP_OFF based on the moving average.

Hereinafter, an operation of the analog-to-digital converter according to example embodiments of the inventive concepts will be described referring to FIGS. 1 to 8.

The analog-to-digital converter according to some example embodiments of the inventive concepts may have a comparator offset compensation mode, an input sampling mode, and an analog-to-digital conversion mode.

Referring to FIG. 2, in the comparator offset compensation mode, the switch circuit 151 of the input sampling capacitor array 150 connects the plurality of capacitors C0 to C(N−1) to the first reference voltage VRH or to the second reference voltage VRL in response to bits of the digital output data SAR. The switch circuit 161 of the reference capacitor array 160 connects the plurality of capacitors C0_R to C(N−1)_R to the first reference voltage VRH or to the second reference voltage VRL in response to bits of the comparator offset compensation signal COMP_OFF. As mentioned above, in the digital-to-analog converting circuit 110 shown in FIG. 2, the capacitances of each of the capacitors C0 to C(N−1) of the input sampling capacitor array 150 may be increased by a multiple of two. Further, the capacitances of each of the capacitors C0_R to C(N−1)_R of the reference capacitor array 160 may be increased by a multiple of two. Therefore, the digital-to-analog converting circuit 110 shown in FIG. 2 is a binary-weighted-capacitor-type digital-to-analog converting circuit. In the comparator offset compensation mode, one bit of the comparator offset may be converted into digital data.

Referring to FIG. 6, the comparator offset compensation mode in which the comparator offset is converted into digital data may have a shorter time than the input sampling mode or the analog-to-digital conversion mode. Only one bit of the comparator offset is converted into digital data whenever an n-bit analog-to-digital conversion is performed on the analog input signal VIN. For example, in case of an analog-to-digital converter of 10 bits, analog-to-digital converted data for 10 bits of the comparator offset may be obtained whenever the analog-to-digital converter performs 10 times of analog-to-digital conversions on the analog input signal VIN. When 10 bits of data for the comparator offset, that is, 10 bits of the comparator offset compensation signal COMP_OFF are obtained, the comparator offset detector 140 provides the comparator offset compensation signal COMP_OFF to the reference capacitor array 160 of the digital-to-analog converting circuit 110.

Referring to FIG. 2, in the input sampling mode, switches of the switch circuit 151 of the input sampling capacitor array 150 connect the plurality of capacitors C0 to C(N−1) to the analog input signal VIN. The first switch SW1 is turned on and the common mode voltage VCM is provided to the first line to which the hold voltage signal VHOLD is output. Therefore, in the input sampling mode, the analog input signal VIN is sampled. Further, in the input sampling mode, the capacitors C0_R to C(N−1)_R of the reference capacitor array 160 are connected to the ground voltage VSS by the switch circuit 161.

In the analog-to-digital conversion mode, the switch circuit 161 of the reference capacitor array 160 connects the capacitors C0_R to C(N−1)_R to the first reference voltage VRH or to the second reference voltage VRL in response to the comparator offset compensation signal COMP_OFF in which the comparator offset signal is compensated during the comparator offset compensation mode. Therefore, in the analog-to-digital conversion mode, the magnitude of the reference voltage signal VREF may be adjusted by the reference capacitor array 160. Further, in the analog-to-digital conversion mode, the switch circuit 151 of the input sampling capacitor array 150 connects the plurality of capacitors C0 to C(N−1) to the first reference voltage VRH or to the second reference voltage VRL in response to bits of the digital output data SAR. Therefore, in the analog-to-digital conversion mode, the analog-to-digital converter 100 performs the successive-approximation.

As described above, the analog-to-digital converter according to example embodiments of the inventive concepts generates the comparator offset compensation signal COMP_OFF based on the output signal of the comparator 120 in the comparator offset compensation mode, and provides the comparator offset compensation signal COMP_OFF to the reference capacitor array 160 of the digital-to-analog converting circuit 110. In the analog-to-digital conversion mode, the magnitude of the reference voltage signal Vref may be adjusted in response to the comparator offset compensation signal COMP_OFF. Therefore, the analog-to-digital converter according to example embodiments of the inventive concepts may compensate for the comparator offset without using a preamplifier. Therefore, the analog-to-digital converter according to example embodiments of the inventive concepts may be used in an ultra-low power analog-to-digital conversion.

Figure 9:
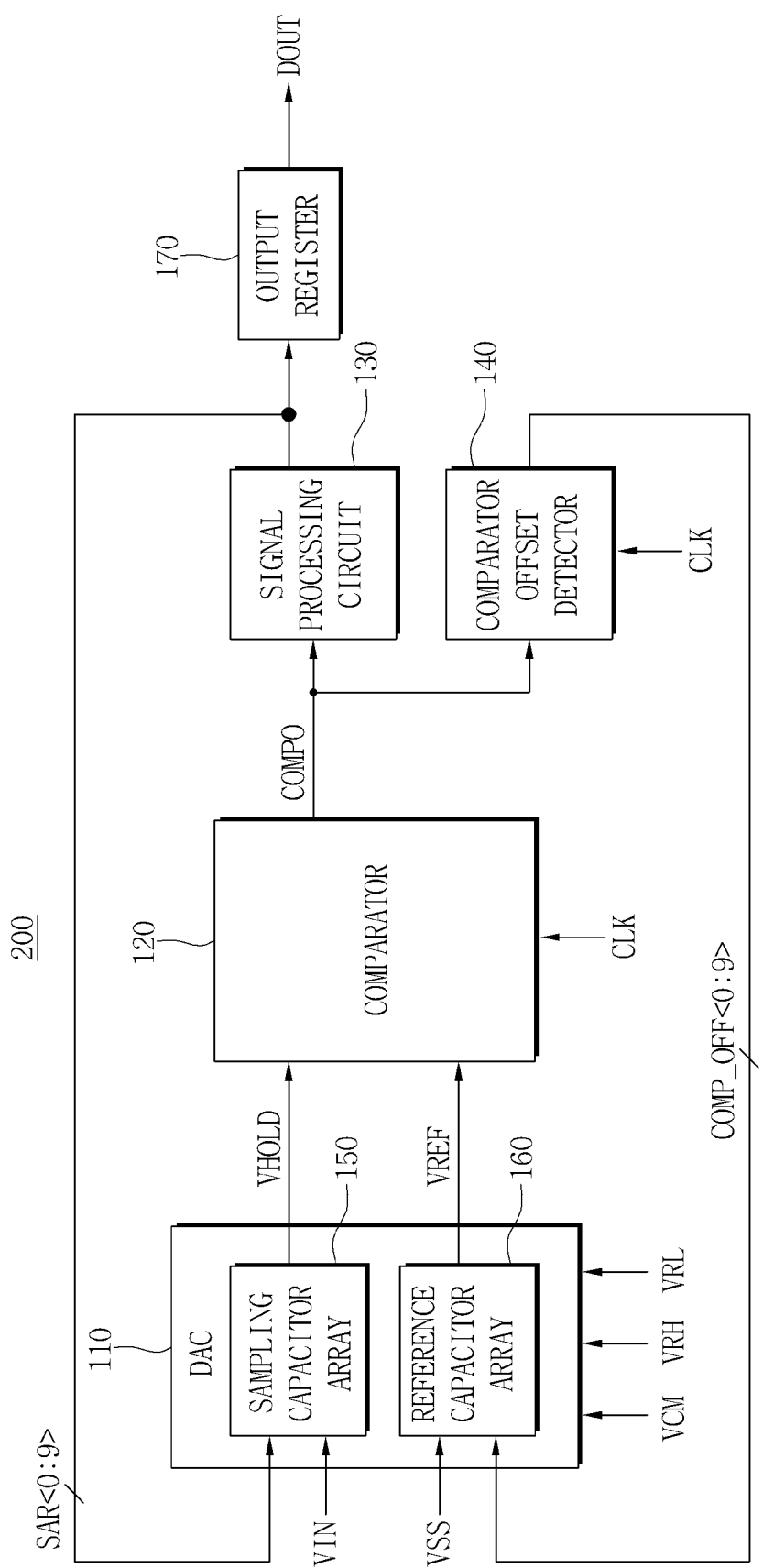
FIG. 9 is a block diagram illustrating an analog-to-digital converter in accordance with another example embodiment of the inventive concepts.

FIG. 9 is a block diagram illustrating an analog-to-digital converter 200 in accordance with another example embodiment of the inventive concept.

Referring to FIG. 9, the analog-to-digital converter 200 includes a digital-to-analog converting circuit 110, a comparator 120, a signal processing circuit 130, a comparator offset detector 140, and an output register 170.

Compared with the analog-to-digital converter 100 of FIG. 1, the analog-to-digital converter 200 of FIG. 9 may further include the output register 170 that stores the digital output data SAR, and outputs the digital output data SAR as output data DOUT when data to be output is determined by the signal processing circuit 130.

The analog-to-digital converter 200 of FIG. 9 may operate similarly to the analog-to-digital converter 100 of FIG. 1.

Figure 10:
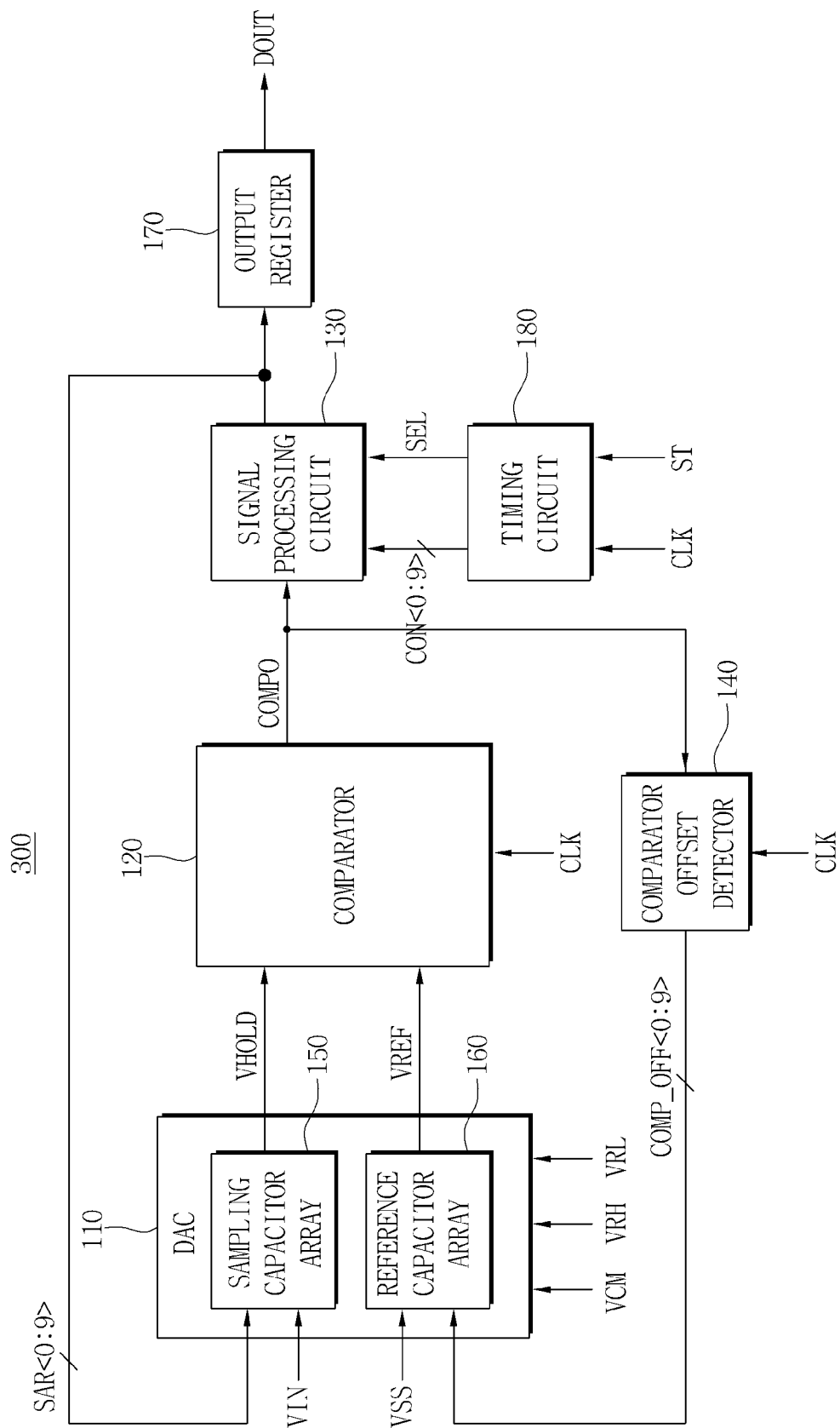
FIG. 10 is a block diagram illustrating an analog-to-digital converter in accordance with still another example embodiment of the inventive concepts.

FIG. 10 is a block diagram illustrating an analog-to-digital converter 300 in accordance with still another example embodiment of the inventive concepts.

Referring to FIG. 10, compared with the analog-to-digital converter 100 of FIG. 1, the analog-to-digital converter 300 of FIG. 10 may further include an output register 170 and a timing circuit 180. The output register 170 stores the digital output data SAR, and outputs the digital output data SAR as output data DOUT when data to be output is determined by the signal processing circuit 130. The timing circuit 180 generates a conversion control signal CON<0:9> based on a clock signal CLK and a conversion start signal ST, and provides the conversion control signal CON<0:9> to the signal processing circuit 130.

The analog-to-digital converter 300 of FIG. 10 may operate similarly to the analog-to-digital converter 100 of FIG. 1.

Figure 11:
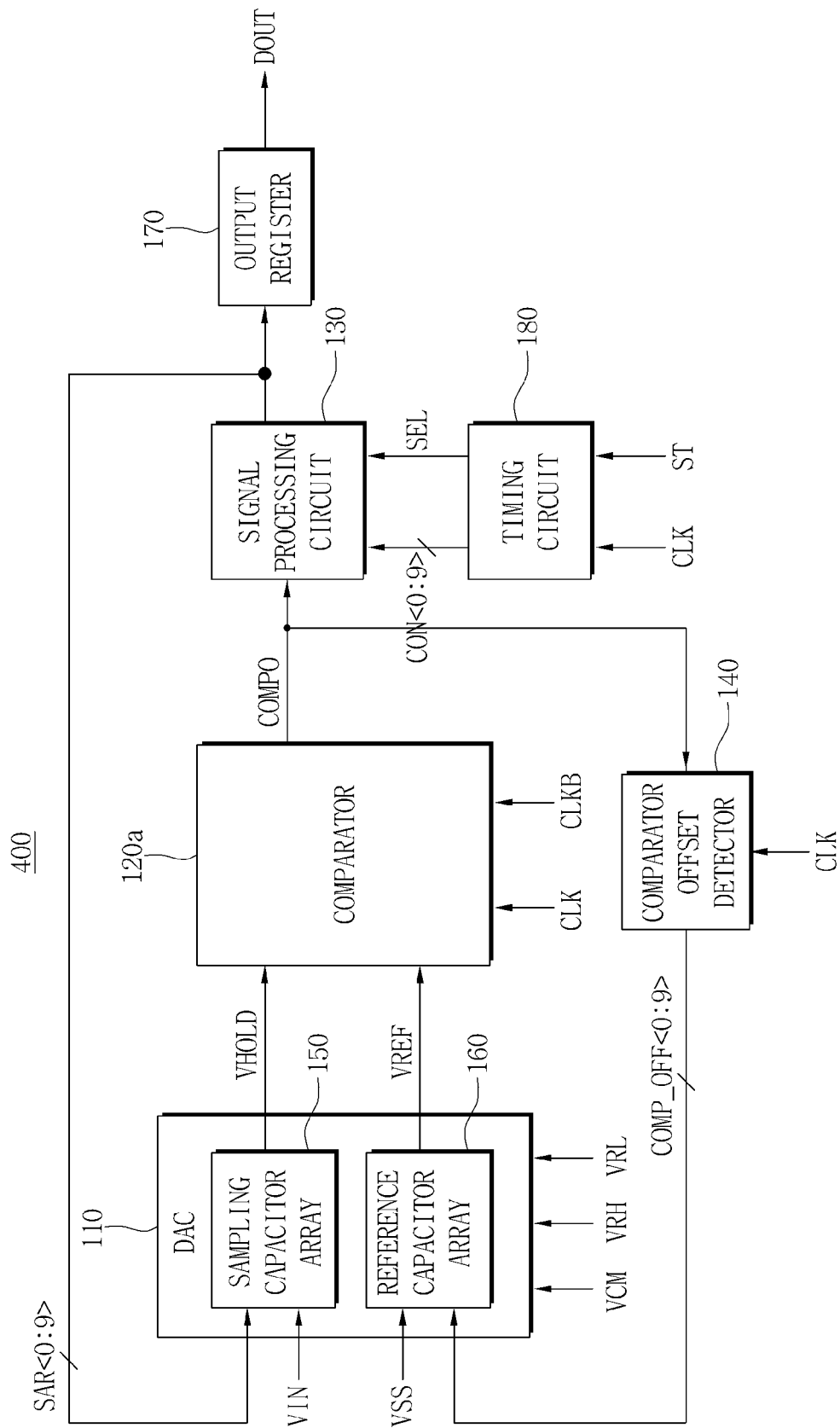
FIG. 11 is a block diagram illustrating an analog-to-digital converter in accordance with yet another example embodiment of the inventive concepts.

FIG. 11 is a block diagram illustrating an analog-to-digital converter 400 in accordance with yet another example embodiment of the inventive concepts.

Referring to FIG. 11, the analog-to-digital converter 400 includes a digital-to-analog converting circuit 110, a comparator 120a, a signal processing circuit 130, a comparator offset detector 140, an output register 170, and a timing circuit 180.

The digital-to-analog converting circuit 110 generates a reference voltage signal VREF that changes in response to a comparator offset compensation signal COMP_OFF, samples and holds an analog input signal VIN, and performs a digital-to-analog conversion on digital output data SAR to generate a hold voltage signal VHOLD. The comparator 120a compares the hold voltage signal VHOLD with a reference voltage signal VREF in response to a rising edge and a falling edge of a clock signal CLK to generate a comparison output voltage signal COMPO. The comparator 120a may operate in response to the clock signal CLK and an inverted clock signal CLKB. The comparator offset detector 140 generates a comparator offset compensation signal COMP_OFF based on the comparison output voltage signal COMPO. The signal processing circuit 130 performs successive approximation based on the comparison output voltage signal COMPO to generate the digital output data SAR. The output register 170 stores the digital output data SAR, and outputs the digital output data SAR as output data DOUT when data to be output is determined by the signal processing circuit 130. The timing circuit 180 generates a conversion control signal CON<0:9> based on the clock signal CLK and a conversion start signal ST, and provides the conversion control signal CON<0:9> to the signal processing circuit 130.

Figure 12:
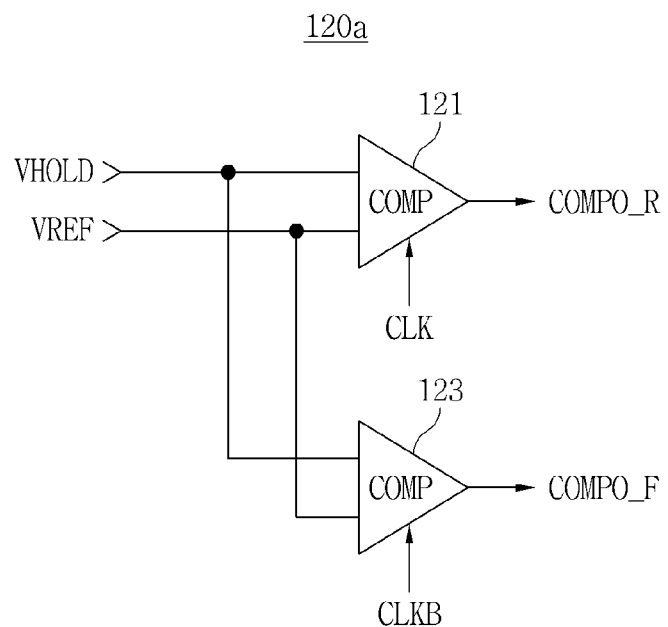
FIG. 12 is a circuit diagram illustrating another example of a comparator included in the analog-to-digital converter of FIG. 11.
Figure 13:
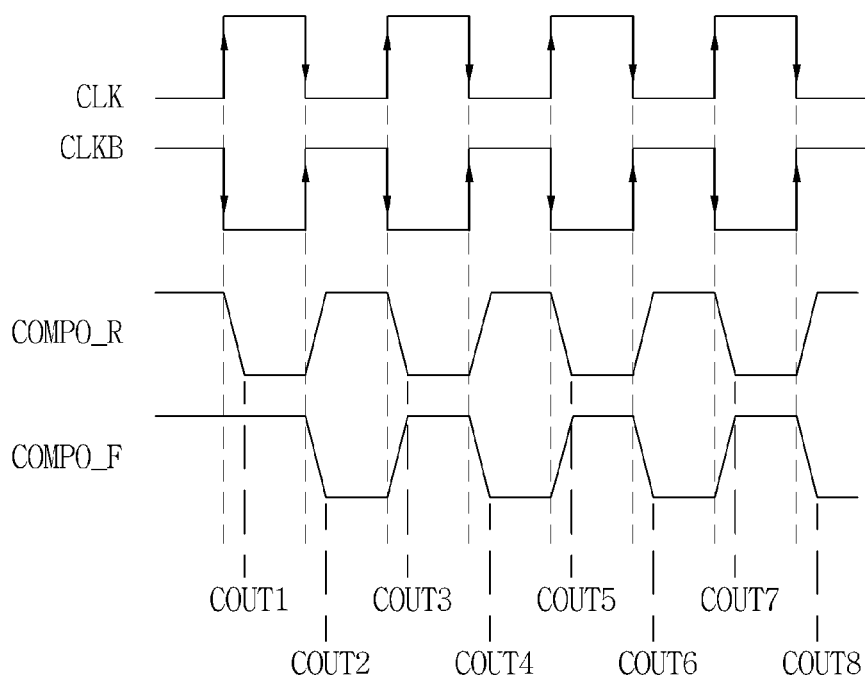
FIG. 13 is a timing diagram illustrating an operation of the comparator of FIG. 12.

FIG. 12 is a circuit diagram illustrating another example of a comparator 120a included in the analog-to-digital converter 400 of FIG. 11, and FIG. 13 is a timing diagram illustrating an operation of the comparator 120a of FIG. 12.

Referring to FIG. 12, the comparator 120a may include a first comparator 121 and a second comparator 123.

The first comparator 121 compares the hold voltage signal VHOLD with the reference voltage signal VREF in response to the clock signal CLK to generate a first comparison output voltage signal COMPO_R. The second comparator 123 compares the hold voltage signal VHOLD with the reference voltage signal VREF in response to the inverted clock signal CLKB having a phase opposite to a phase of the clock signal CLK to generate a second comparison output voltage signal COMPO_F.

Referring to FIG. 13, the first comparison output voltage signal COMPO_R is enabled at a rising edge of the clock signal CLK, and the second comparison output voltage signal COMPO_F is enabled at a rising edge of the inverted clock signal CLKB. Therefore, the comparator 120a operates at the rising edge and falling edge of the clock signal CLK, and generates the comparison output voltage signals COMPO_R and COMPO_F.

The comparison output voltage signal COMPO of the comparator 120a is a signal that a pulse train COUT1, COUT3, COUT5, and COUT7 of the first comparison output voltage signal COMPO_R and a pulse train COUT2, COUT4, COUT6, and COUT8 of the second comparison output voltage signal COMPO_F are added alternately.

In an analog-to-digital converter including two comparators 121 and 123 as shown in FIG. 12, two of the signal processing circuit 130 of FIG. 4 may be needed. In this case, outputs of two demultiplexers are alternately output. In the analog-to-digital converter including two comparators, a respective output of the two comparators may be connected to a respective demultiplexer, and outputs of the comparators are output alternately and sequentially.

Figure 14:
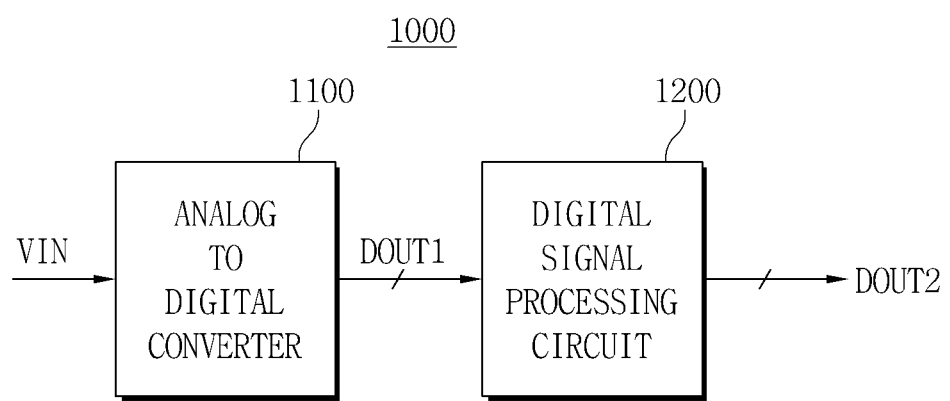
FIG. 14 is a block diagram illustrating a semiconductor device including an analog-to-digital converter in accordance with example embodiments of the inventive concepts.

FIG. 14 is a block diagram illustrating a semiconductor device including an analog-to-digital converter in accordance with example embodiments of the inventive concepts.

Referring to FIG. 14, a semiconductor device 1000 includes an analog-to-digital converter 1100 and a digital signal processing circuit 1200.

The analog-to-digital converter 1100 converts an analog input signal VIN to a digital signal to generate a first digital output data DOUT1. The digital signal processing circuit 1200 performs digital signal processing on the first digital output data DOUT1 to generate a second digital output data DOUT2. The analog-to-digital converter 1100 may be one of the analog-to-digital converters according to embodiments of the inventive concepts. For example, the analog-to-digital converter 1100 may be embodied as the analog-to-digital converter 100. The analog-to-digital converter 1100 may include a digital-to-analog converting circuit, a comparator, a comparator offset detector, and a signal processing circuit. The digital-to-analog converting circuit generates a reference voltage signal that changes in response to a comparator offset compensation signal, samples and holds an analog input signal, and performs a digital-to-analog conversion on digital output data to generate a hold voltage signal VHOLD. The comparator compares the hold voltage signal with the reference voltage signal in response to a clock signal to generate a comparison output voltage signal. The comparator offset detector generates the comparator offset compensation signal based on the comparison output voltage signal. The signal processing circuit performs successive approximation based on the comparison output voltage signal to generate the digital output data.

Figure 15:
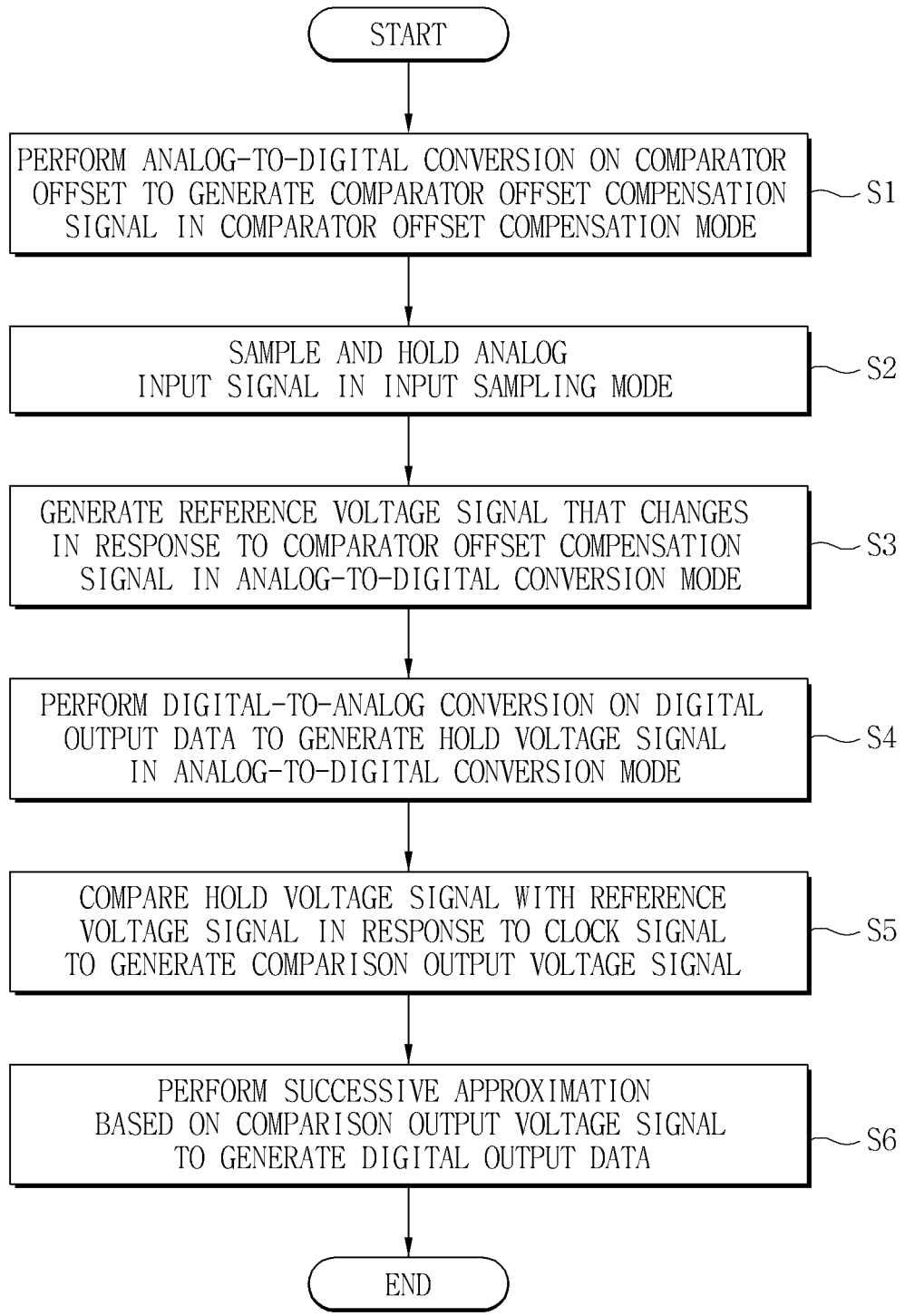
FIG. 15 is a flowchart illustrating a method of analog-to-digital conversion in accordance with an example embodiment of the inventive concepts.

FIG. 15 is a flowchart illustrating a method of analog-to-digital conversion in accordance with an example embodiment of the inventive concepts.

Referring to FIG. 15, the method of analog-to-digital conversion with example embodiments of the inventive concept may include operations performed by an analog to digital converter, for example, the analog to digital converter 100. The analog to digital converter 100 may perform an analog-to-digital conversion on a comparator offset to generate a comparator offset compensation signal in a comparator offset compensation mode (S1), sample and hold an analog input signal in an input sampling mode (S2), generate a reference voltage signal that changes in response to the comparator offset compensation signal in an analog-to-digital conversion mode (S3), perform a digital-to-analog conversion on digital output data to generate a hold voltage signal (VHOLD) in the analog-to-digital conversion mode (S4), compare the hold voltage signal with the reference voltage signal in response to a clock signal to generate a comparison output voltage signal (S5) and perform successive approximation based on the comparison output voltage signal to generate the digital output data (S6).

Figure 16:
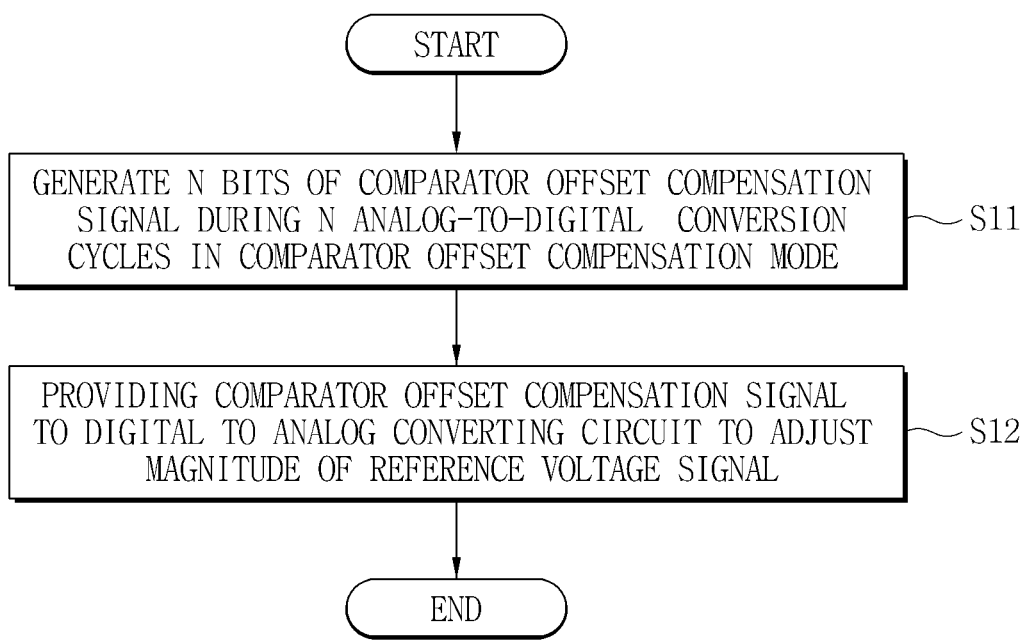
FIG. 16 is a flowchart illustrating an operation of generating a comparator offset compensation signal in the method of analog-to-digital conversion of FIG. 15.

FIG. 16 is a flowchart illustrating an operation of generating a comparator offset compensation signal in the method of analog-to-digital conversion of FIG. 15. Referring to FIG. 16, the analog to digital converter 100 generating a comparator offset compensation signal may include generating n bits of the comparator offset compensation signal during n analog-to-digital conversion cycles (n is a natural number greater than or equal to two) in the comparator offset compensation mode (S11), and providing the comparator offset compensation signal to the digital-to-analog converting circuit to adjust a magnitude of the reference voltage signal (S12).

The method of analog-to-digital conversion with example embodiments of the inventive concepts may be applied to an asynchronous analog-to-digital converter as well as to a synchronous analog-to-digital converter.

Example embodiments of the inventive concepts may be applied to an analog-to-digital converter that performs analog-to-digital conversion using a successive-approximation technique and a semiconductor device having the same.

The foregoing is illustrative of example embodiments and is not to be construed as limiting thereof. Although a few example embodiments have been described, those skilled in the art will readily appreciate that many modifications are possible in embodiments without materially departing from the novel teachings and advantages. Accordingly, all such modifications are intended to be included within the scope of these inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An analog-to-digital converter, comprising:
   a digital-to-analog converting circuit configured to,
      generate a reference voltage signal, the reference voltage signal changing in response to a comparator offset compensation signal,
      sample and hold an analog input signal, and
      perform a digital-to-analog conversion on digital output data to generate a hold voltage signal;

a comparator configured to compare the hold voltage signal with the reference voltage signal in response to a clock signal to generate a comparison output voltage signal;

a comparator offset detector configured to generate one bit of the comparator offset compensation signal based on the comparison output voltage signal; and a signal processing circuit configured to perform analog-to-digital conversion using a successive approximation based on the comparison output voltage signal to generate the digital output data having n bits during each of a plurality of iterations of the analog-to-digital conversion, where n is a natural number greater than or equal to two, such that during one of the plurality of iterations of the analog-to-digital conversion one bit of the n bits of the digital output data is finalized from a most significant bit (MSB) to a least significant bit (LSB) and during the one of the plurality of iterations one bit of the comparison offset compensation signal is generated.

2. The analog-to-digital converter of claim 1, wherein the analog-to-digital converter is configured to,
perform an analog-to-digital conversion on a comparator offset to generate the comparator offset compensation signal in a comparator offset compensation mode, and
adjust a magnitude of the reference voltage signal in response to the comparator offset compensation signal in an analog-to-digital conversion mode.

3. The analog-to-digital converter of claim 2, wherein the comparator offset detector is configured to generate one bit of the comparator offset compensation signal during one analog-to-digital conversion cycle in the comparator offset compensation mode.

4. The analog-to-digital converter of claim 2, wherein the comparator offset detector is configured to,
generate n bits of the comparator offset compensation signal during n analog-to-digital conversion cycles, where n is a natural number greater than or equal to two,
provide the comparator offset compensation signal to the digital-to-analog converting circuit, and
adjust a magnitude of the reference voltage signal, in the comparator offset compensation mode.

5. The analog-to-digital converter of claim 1, wherein the digital-to-analog converting circuit comprises:
an input sampling capacitor array configured to,
sample and hold the analog input signal in an input sampling mode, and
perform a digital-to-analog conversion on the digital output data to generate the hold voltage signal in an analog-to-digital conversion mode; and
a reference capacitor array configured to,
perform an analog-to-digital conversion on a comparator offset to generate the comparator offset compensation signal in a comparator offset compensation mode, and
adjust a magnitude of the reference voltage signal in response to the comparator offset compensation signal in the analog-to-digital conversion mode.

6. The analog-to-digital converter of claim 5, wherein the input sampling capacitor array comprises:
a switch circuit including a plurality of switches, each switch configured to select one of an input signal, a first reference voltage, and a second reference voltage in response to bits of the digital output data;
a plurality of capacitors, each of the capacitors being connected between a first line from which the hold voltage signal is output and one of the plurality of switches;

a first capacitor connected between the first line and the second reference voltage; and
a first switch connected between a common mode voltage and the first line.

7. The analog-to-digital converter of claim 5, wherein the reference capacitor array comprises:
a switch circuit including a plurality of switches, each switch configured to select one of a ground voltage, a first reference voltage, and a second reference voltage in response to bits of the comparator offset compensation signal;
a plurality of capacitors, each capacitor connected between a second line from which the reference voltage signal is output and one of the plurality of the switches;
a first capacitor connected between the second line and the second reference voltage; and
a first switch connected between a common mode voltage and the second line.

8. The analog-to-digital converter of claim 1, wherein the comparator comprises:
a first comparator configured to compare the hold voltage signal with the reference voltage signal in response to a first clock signal to generate a first comparison output voltage signal; and
a second comparator configured to compare the hold voltage signal with the reference voltage signal in response to a second clock signal having a phase opposite to a phase of the first clock signal to generate a second comparison output voltage signal.

9. The analog-to-digital converter of claim 1, wherein the comparator offset detector comprises:
a shift register configured to shift the comparison output voltage signal one bit at a time in response to the clock signal; and
a register configured to,
temporarily store bits of an output of the shift register, and
output the comparator offset compensation signal based on the bits of the output of the shift register.

10. The analog-to-digital converter of claim 1, wherein the comparator offset detector comprises:
a shift register configured to shift the comparison output voltage signal one bit at a time in response to the clock signal;
a register configured to temporarily store bits of an output of the shift register; and
an average circuit configured to,
calculate an average of bits of the output of the shift register, and
output the comparator offset compensation signal based on the average.

11. The analog-to-digital converter of claim 1, wherein the comparator offset detector comprises:
a shift register configured to shift the comparison output voltage signal one bit at a time in response to the clock signal;
a register configured to temporarily store bits of an output of the shift register; and
an moving average circuit configured to,
calculate a moving average of bits of the output of the shift register, and
output the comparator offset compensation signal based on the moving average.

12. The analog-to-digital converter of claim 1, further comprising:
an output register configured to,
store the digital output data, and output the digital output data as output data based on a determination by the signal processing circuit.

13. The analog-to-digital converter of claim 1, wherein the digital-to-analog converting circuit is a binary-weighted-capacitor-type digital-to-analog converting circuit.

14. An analog-to-digital converter configured to convert an analog input signal to digital output data, the digital output data being n bits, where n is a natural number greater than or equal to two, the analog-to-digital converter comprising:
 a comparator configured to compare a hold voltage signal and a reference signal and generate a comparison output voltage signal based on a result of the comparison, the comparator having an offset associated therewith and the reference signal varying to compensate for the offset;
 a digital-to-analog conversion circuit configured to,
  sample and hold the analog input signal to generate the hold voltage signal, and
  generate the reference signal based on a comparison offset compensation signal such that the comparison offset compensation signal adjusts to the reference signal to compensate for the offset; and
 a signal processing circuit configured to perform analog-to-digital conversion on the comparison output voltage via successive approximation of each bit of the comparison output voltage to generate the digital output data such that, during the successive approximation of each bit of the comparison output voltage, the n bits of the digital output data are generated and one bit of the comparison offset compensation signal is generated.

15. The analog-to-digital converter of claim 14, wherein the analog-to-digital converter is configured to compensate for the offset associated with the comparator by varying the reference signal without using a preamplifer.

16. The analog-to-digital converter of claim 14, wherein the comparator is configured to compare the hold voltage signal with the reference signal in response to a clock signal, and the analog-to-digital converter further comprises:
 a comparator offset detector configured to shift the comparison output voltage signal one bit at a time in response to the clock signal.

17. The analog-to-digital converter of claim 14, further comprising:
 a comparison offset detector configured to generate the comparison offset compensation signal by performing analog-to-digital conversion on the offset associated with the comparator, wherein one bit of the comparator offset compensation signal is digitized each time the analog-to-digital converter generates the n bits of the digital output data when performs analog-to-digital conversion on the analog input signal.

18. The analog-to-digital converter of claim 17, wherein the comparison offset detector generates the comparison offset compensation signal when the analog-to-digital converter is operating in a comparator offset compensation mode, and the digital-to-analog conversion circuit is configured to,
 sample and hold the analog input signal when the analog-to-digital converter is operating in an input sampling mode, and
 adjust a magnitude of the reference signal when the analog-to-digital converter is operating in an analog-to-digital conversion mode, wherein
  the comparator offset compensation mode, the input sampling mode and the analog-to-digital conversion mode occur consecutively and the comparator offset compensation mode is shorter than the analog-to-digital conversion mode.

19. An analog-to-digital converter, comprising:
 a digital-to-analog converting circuit configured to,
  generate a reference voltage signal, the reference voltage signal changing in response to a comparator offset compensation signal,
  sample and hold an analog input signal, and
  perform a digital-to-analog conversion on digital output data to generate a hold voltage signal;
 a comparator configured to compare the hold voltage signal with the reference voltage signal in response to a clock signal to generate a comparison output voltage signal;
 a comparator offset detector configured to generate one bit of the comparator offset compensation signal which is generated in each iteration of the analog-to-digital conversion performed during a successive approximation and adjust the reference voltage signal to compensate for the offset based on the comparison output voltage signal; and
 a signal processing circuit configured to perform analog-to-digital conversion using the successive approximation based on the comparison output voltage signal to generate the digital output data having n bits during each of a plurality of iterations of the analog-to-digital conversion where n is a natural number greater than or equal to two, such that during one of the plurality of iterations of the analog-to-digital conversion one bit of the n bits of the digital output data is finalized from a most significant bit (MSB) to a least significant bit (LSB).

\* \* \* \* \*